United States Patent
Wang et al.

(10) Patent No.: US 9,960,093 B2
(45) Date of Patent: May 1, 2018

(54) PACKAGING STRUCTURE, PACKAGING METHOD AND TEMPLATE USED IN PACKAGING METHOD

(71) Applicant: Tsinghua University, Beijing (CN)

(72) Inventors: Qian Wang, Beijing (CN); Lin Tan, Beijing (CN); Jian Cai, Beijing (CN); Yu Chen, Beijing (CN)

(73) Assignee: TSINGHUA UNIVERSITY, Beijing (CN)

(*) Notice: Subject to any disclaimer, the term of this patent is extended or adjusted under 35 U.S.C. 154(b) by 0 days. days.

(21) Appl. No.: 15/113,639

(22) PCT Filed: Jan. 27, 2014

(86) PCT No.: PCT/CN2014/071564
§ 371 (c)(1),
(2) Date: Jul. 22, 2016

(87) PCT Pub. No.: WO2015/109596
PCT Pub. Date: Jul. 30, 2015

(65) Prior Publication Data
US 2017/0005022 A1    Jan. 5, 2017

(30) Foreign Application Priority Data
Jan. 26, 2014    (CN) .......................... 2014 1 0037714

(51) Int. Cl.
*H01L 21/00*     (2006.01)
*H01L 23/31*     (2006.01)
(Continued)

(52) U.S. Cl.
CPC ...... *H01L 23/3128* (2013.01); *H01L 21/0206* (2013.01); *H01L 21/56* (2013.01);
(Continued)

(58) Field of Classification Search
CPC ....... H01L 23/28; H01L 23/29; H01L 23/293; H01L 23/31; H01L 23/3107;
(Continued)

(56) References Cited

U.S. PATENT DOCUMENTS 3,255,006 A * 6/1966 Bailey ..................... G03F 7/027
430/286.1
5,247,423 A * 9/1993 Lin ......................... H05K 1/144
174/252
(Continued)

FOREIGN PATENT DOCUMENTS

CN     1449583 A    10/2003
CN     1462070 A    12/2003
(Continued)

OTHER PUBLICATIONS

Russell Peek, Liquid Encapsulation Protects Electronic Components, 2011, GPD Global, Encapsulation Technical Article (Mar. 20, 2001, Featured in the May 2001 issue of EP&P magazine.*
(Continued)

*Primary Examiner* — Reema Patel
*Assistant Examiner* — Syed Gheyas
(74) *Attorney, Agent, or Firm* — Volpe and Koenig, P.C.

(57) ABSTRACT

Disclosed are a packaging structure, a packaging method and a template used in packaging method. The packaging structure comprises: a substrate; a chip mounted on the substrate; bonding wires for electrically connecting the substrate to the chip; and a protective layer which is formed on the substrate and is used for covering the chip, the bonding wires and bonding pads connected to the bonding wires, the size of the protective layer being smaller than that of the substrate. The packaging structure, the packaging method and the template used in packaging method can solve the problems in the prior art of the great difficulty in
(Continued)

designing a mold chase, a complicated molding process, a high manufacturing cost and a high molding material consumption.

2 Claims, 5 Drawing Sheets

(51) Int. Cl.
    *H01L 21/56*     (2006.01)
    *H01L 21/02*     (2006.01)
    *H01L 23/29*     (2006.01)
    *H01L 23/00*     (2006.01)

(52) U.S. Cl.
    CPC .......... *H01L 21/565* (2013.01); *H01L 21/568* (2013.01); *H01L 23/293* (2013.01); *H01L 24/49* (2013.01); *H01L 24/85* (2013.01); *H01L 24/48* (2013.01); *H01L 24/73* (2013.01); *H01L 2224/04042* (2013.01); *H01L 2224/06135* (2013.01); *H01L 2224/32225* (2013.01); *H01L 2224/48106* (2013.01); *H01L 2224/48227* (2013.01); *H01L 2224/49175* (2013.01); *H01L 2224/73265* (2013.01); *H01L 2924/00014* (2013.01); *H01L 2924/0665* (2013.01); *H01L 2924/15311* (2013.01); *H01L 2924/181* (2013.01)

(58) Field of Classification Search
    CPC ..... H01L 23/3142; H01L 24/49; H01L 24/85; H01L 21/56; H01L 21/565; H01L 21/566; H01L 21/568
    See application file for complete search history.

(56) References Cited

U.S. PATENT DOCUMENTS

| 5,953,589 A | 9/1999 | Shim et al. |
| 6,160,311 A | 12/2000 | Chen et al. |
| 2003/0178709 A1 | 9/2003 | Andoh |
| 2006/0012056 A1 | 1/2006 | Ueno et al. |
| 2008/0251875 A1 | 10/2008 | Wu et al. |
| 2010/0224972 A1 | 9/2010 | Powell et al. |
| 2011/0024861 A1 | 2/2011 | Tu et al. |

FOREIGN PATENT DOCUMENTS

| CN | 1722392 A | 1/2006 |
| CN | 101286502 A | 10/2008 |
| CN | 101989555 A | 3/2011 |
| WO | 02/09180 A1 | 1/2002 |

OTHER PUBLICATIONS

International Search Report, PCT/CN2014/071564, dated Oct. 31, 2014, 2 pgs.

\* cited by examiner

US 9,960,093 B2

PACKAGING STRUCTURE, PACKAGING METHOD AND TEMPLATE USED IN PACKAGING METHOD

FIELD OF THE INVENTION

The present invention relates to the semiconductor field, in particular to a packaging structure, a packaging method, and a template used in packaging method.

BACKGROUND OF THE INVENTION

The conventional packaging process of Fine-Pitch Ball Grid Array (FBGA) products is shown in FIG. 1: S100: chip attachment; S102: wire bonding; S104: molding and curing; S106: ball mounting; S108: singulation. In the step S104, the molding process is to inject a molding compound into a mold chase at high temperature and high pressure, so that the molding compound covers the entire top surface of the substrate, has polymeric cross-linking reactions, and then is cured, to attain a purpose of protecting the bonding wires and improving the reliability of the devices. FIG. 2 is a side view of the packaging structure in the prior art, and FIG. 3 is a top view of the packaging structure in the prior art, wherein, the symbol 10 indicates the substrate, the symbol 12 indicates the chip, the symbol 14 indicates the bonding wires, the symbol 16 indicates the molding compound, and the symbol 18 indicates the solder ball array. However, that process is time-consuming, the mold chase is difficult to design, and the molding process is complex and involves high cost and high molding material consumption.

SUMMARY OF THE INVENTION

The objective of the present invention is to provide a packaging structure, a packaging method, and a template used in packaging method, in order to solve the problems in the prior art, i.e., the mold chase is difficult to design, and the molding process is complex, involves high cost and high molding material consumption.

To attain the objective described above, the present invention provides a packaging structure, comprising: a substrate; a chip, mounted on the substrate; bonding wires, configured to electrically connect the substrate with the chip; and a protective layer, formed on the substrate and configured to cover the chip, the bonding wires and bonding pads connected with the bonding wires, the size of the protective layer being smaller than the size of the substrate.

Preferably, the protective layer is formed from an epoxy encapsulation material.

The present invention further provides a packaging method, comprising: providing a substrate; mounting a chip on the substrate; electrically connecting the substrate with the chip via bonding wires through a wire bonding process; placing a template on the substrate, the template has a cavity configured to expose the chip, the bonding wires, and the bonding pads connected with the bonding wires, and the height of the template is higher than the height of the bonding wires; forming a protective layer in the cavity; and removing the template.

Preferably, the method further comprises: coating a surface coating material on the bottom surface of the template, before the template is placed on the substrate; and removing the template by cleaning the surface coating material with an organic solvent.

Preferably, the protective layer is formed from an epoxy encapsulation material.

Preferably, forming a protective layer in the cavity comprises: filling the epoxy encapsulation material into the cavity; and forming the protective layer by executing a curing process of the epoxy encapsulation material.

Preferably, the epoxy encapsulation material is filled into the cavity through an adhesive dispensing process or printing process.

Preferably, in the case that the epoxy encapsulation material is filled into the cavity through an adhesive dispensing process, a plurality of holes is formed in the template except for the cavity. The present invention further provides a template used in the above-mentioned packaging method, wherein the template has a cavity configured to expose the chip, the bonding wires, and the bonding pads connected with the bonding wires, and the height of the template is higher than the height of the bonding wires.

Preferably, a plurality of holes is formed in the template except for the cavity.

With the above-mentioned technical scheme, a template having a cavity configured to expose the chip, the bonding wires, and the bonding pads connected with the bonding wires is arranged in the packaging process, so that a protective layer can be formed in the cavity of the template to protect the chip, the bonding wires, and the bonding pads connected with the bonding wires; thus, the use of large-size molding equipment and complex mold chase design are avoided, the manufacturing process is simplified, and the manufacturing cost is reduced. In addition, since the protective layer doesn't have to cover the entire substrate surface, the material consumption can be reduced, and the weight of the packaged device can be reduced. Moreover, by using a template, the overall height of the device can be reduced/controlled.

Other features and advantages of the present invention will be further detailed in the embodiments hereunder.

DESCRIPTION OF THE DRAWINGS

The accompanying drawings are provided here to facilitate further understanding on the present invention, and constitute a part of this document. They are used in conjunction with the following embodiments to explain the present invention, but shall not be comprehended as constituting any limitation to the present invention, wherein.

DETAILED DESCRIPTION OF THE EMBODIMENTS

Hereunder the embodiments of the present invention will be detailed, with reference to the accompanying drawings. It should be understood that the embodiments described here are only provided to describe and explain the present invention, but shall not be deemed as constituting any limitation to the present invention. In the present invention, identical symbols are used to represent the same elements.

Figure 1:
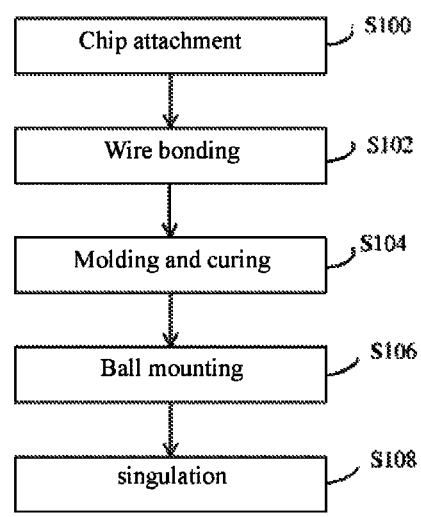
FIG. 1 is a flow chart of the packaging method in the prior art.
Figure 2:
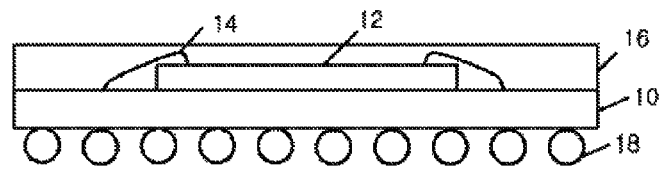
FIG. 2 shows a side view of the packaging structure in the prior art.
Figure 3:
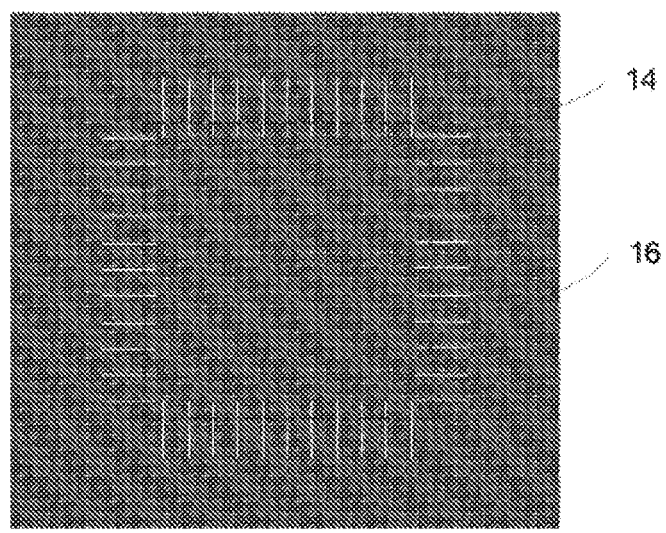
FIG. 3 shows a top view of the packaging structure in the prior art.
Figure 4:
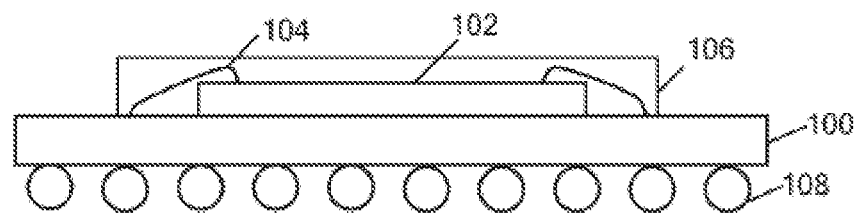
FIG. 4 is a schematic sectional view of the packaging structure according to the present invention.

FIG. 4 is a schematic sectional view of the packaging structure according to the present invention. As shown in FIG. 4, the packaging structure provided in the present invention comprises: a substrate 100; a chip 102, mounted on the substrate 100; bonding wires 104, configured to electrically connect the substrate 100 with the chip 102; and a protective layer 106, formed on the substrate 100 and configured to cover the chip 102, the bonding wires 104, and bonding pads (not shown) connected with the bonding wires 104, wherein, the size of the protective layer 106 being smaller than the size of the substrate 100.

The packaging structure provided in the present invention may further comprises a solder ball array 108 formed on the bottom surface of the substrate 100.

Since a protective layer 106 is formed on the packaging structure according to the present invention, the chip, the bonding wires, and the bonding pad connected with the bonding wires are protected; in addition, since the size of the protective layer 106 being smaller than the size of the substrate 100 (i.e., the protective layer 106 doesn't have to cover the entire substrate surface), the material consumption of the protective layer can be reduced, and the weight of the device can be reduced.

According to an embodiment of the present invention, the protective layer 106 is formed from an epoxy encapsulation material. The epoxy encapsulation material has good fluidity, capability to resist mechanical impacts, chemical corrosion, and high temperature and high humidity, and doesn't have adverse effect to the shape and the bonding force of the bonding wires. Therefore, the protective layer 106 formed from the epoxy encapsulation material can provide protection that is strong enough for the chips, the bonding wires, and the bonding pads connected with the bonding wires. Those skilled in the art should understand that the above-mentioned epoxy encapsulation material is only exemplary, but doesn't constitute any limitation to the present invention.

Figure 5:
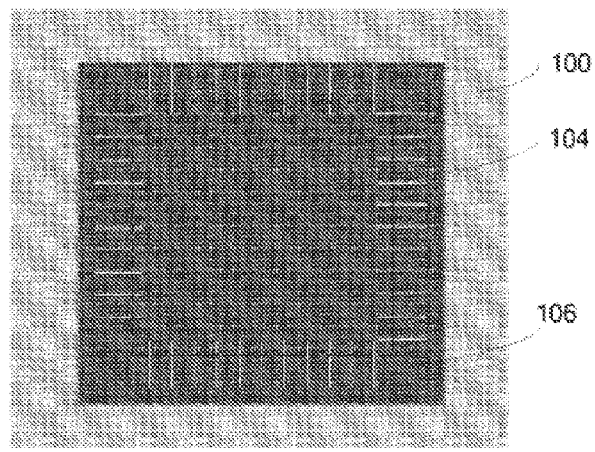
FIG. 5 is a top view of the packaging structure according to the present invention.

FIG. 5 is a top view of the packaging structure according to the present invention. As shown in FIG. 5, the protective layer 106 formed from the epoxy encapsulation material doesn't cover the peripheral part of the substrate.

Figure 6:
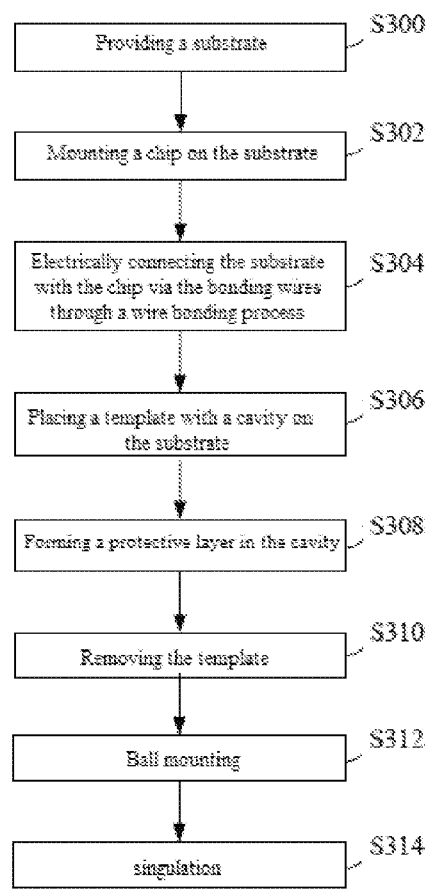
FIG. 6 is a flow chart of the packaging method according to the present invention.

FIG. 6 is a flow chart of the packaging method according to the present invention.

As shown in FIG. 6, the packaging method provided in the present invention comprises:

S300: providing a substrate;
S302: mounting a chip on the substrate;
S304: electrically connecting the substrate with the chip via bonding wires through a wire bonding process;
S306: placing a template on the substrate, wherein the template has a cavity configured to expose the chip, the bonding wires, and the bonding pads connected with the bonding wires, and the height of the template is higher than the height of the bonding wires;
S308: forming a protective layer in the cavity; and
S310: removing the template.

By arranging a template having a cavity configured to expose the chip, the bonding wires, and the bonding pads connected with the bonding wires in the packaging assembly process, a protective layer can be formed in the cavity of the template to protect the chip, the bonding wires, and the bonding pads connected with the bonding wires; thus, the use of large-size molding equipment and complex mold chase design are avoided, the manufacturing process is simplified, and the manufacturing cost is reduced. In addition, since the protective layer doesn't have to cover the entire substrate surface, the material consumption can be reduced, and the weight of the device can be reduced. Moreover, by using a template, the overall height of the device can be reduced/controlled.

Wherein, the method may further comprises the following steps after the step S310:

S312: forming a solder ball array on the bottom surface of the substrate through a ball mounting process;
S314: cutting the substrate through a singulation process.

Before the step S306 in the method, a surface coating material is applied on the bottom surface of the template, so that the bottom surface of the template is tightly coupled to the top surface of the substrate, and overflow of the protective layer material can be prevented in the protective layer forming process, wherein, the surface coating material may have a high temperature resistance property.

In the case that a surface coating material is applied on the bottom surface of the template, the surface coating material is cleaned with an organic solvent before the step S310, so that the template can be removed. By cleaning the surface coating material with an organic solvent, the template can be removed more easily, and any residue of the surface coating material can be prevented; thus, the template can be reused, and the utilization of the template can be improved. Those skilled in the art can select the surface coating material and the organic solvent as required. There is no particular restriction on them in the present invention.

According to an embodiment of the present invention, the protective layer is formed from an epoxy encapsulation material. The epoxy encapsulation material has good fluidity, capability to resist mechanical impacts, chemical corrosion, and high temperature and high humidity, and doesn't have adverse effect to the shape and the bonding force of the bonding wires. Therefore, the protective layer formed from the epoxy encapsulation material can provide protection that is strong enough for the chips, the bonding wires, and the bonding pads connected with the bonding wires. Those skilled in the art should understand that the above-mentioned epoxy encapsulation material is only exemplary, but doesn't constitute any limitation to the present invention.

In the method, the step S308 comprises:
filling the epoxy encapsulation material into the cavity; and
forming the protective layer by executing a curing process of the epoxy encapsulation material.

In the epoxy encapsulation material filling process, the substrate and the epoxy encapsulation material can be heated, to speed up the filling of the epoxy encapsulation material. By way of filling the epoxy encapsulation material into the cavity, the problem of small voids formed by residual air in the conventional molding process can be avoided.

Figure 9:
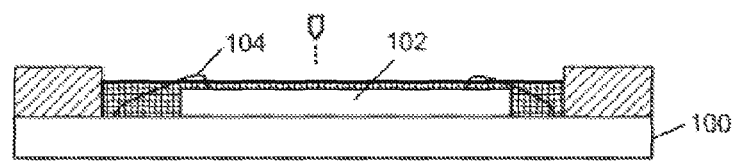
FIG. 9 is a schematic diagram of the adhesive dispensing process used in the packaging method according to the present invention.
Figure 10:
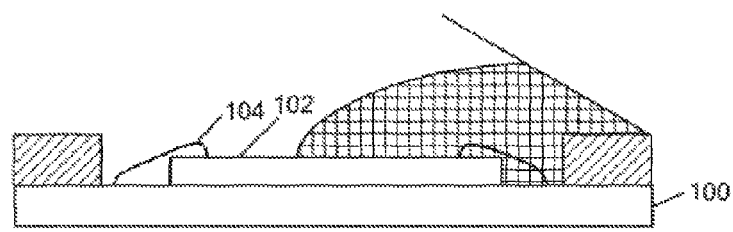
FIG. 10 is a schematic diagram of the printing process used in the packaging method according to the present invention.

According to an embodiment of the present invention, the epoxy encapsulation material is filled into the cavity through an adhesive dispensing process or printing process. FIG. 9 and FIG. 10 show the adhesive dispensing process and the printing process used in the present invention respectively, wherein, the part shown with hatch lines represents the template, and the parts shown with grid lines represent the epoxy encapsulation material being filled (i.e., the epoxy encapsulation material being filled into the cavity).

In the case that the epoxy encapsulation material is filled into the cavity through an adhesive dispensing process, a plurality of holes may be formed in the template except for the cavity. By arranging a plurality of holes in the template, the ineffective material can be omitted, and the weight of the template can be reduced. The positions, shape, and quantity of the holes in the template can be determined according to the actual requirement. There is no particular restriction on them in the present invention.

In the present invention, the packaging structure shown in FIG. 4 can be produced with the packaging method shown in FIG. 6.

Figure 7:
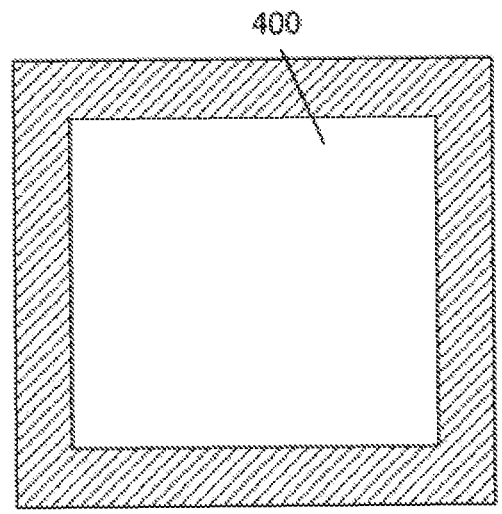
FIG. 7 is a top view of the template used in the packaging method according to the present invention.

FIG. 7 is a top view of the template used in the packaging method according to the present invention. The part shown with hatch lines in FIG. 7 represents the outer frame of the template. The present invention further provides a template used in the packaging method described in the above embodiments. As shown in FIG. 7, the template has a cavity 400 configured to expose the chip, the bonding wire, and the bonding pads connected with the bonding wires, and the height of the template is higher than the height of the bonding wires.

Wherein, the material of the template can be stainless steel (i.e., a material similar to the material of a stencil used for screen printing can be selected); thus, the template can have advantages including high strength and resistance to deformation, etc. In addition, the template can be reused after it is removed. Those skilled in the art should understand that the above-mentioned template material is only exemplary, but doesn't constitute any limitation to the present invention.

Figure 8:
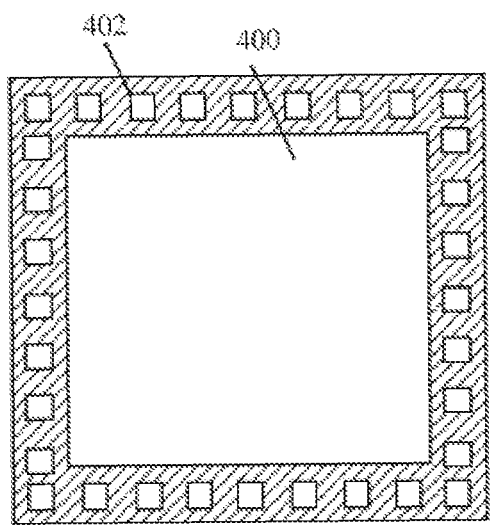
FIG. 8 is a top view of the template with a plurality of holes used in the packaging method according to the present invention.

In the case that a protective layer is formed in the cavity through an adhesive dispensing process, a plurality of holes 402 may be formed in the template except for the cavity 400 (as shown in FIG. 8, a plurality of hole is formed in the outer frame of the template. FIG. 8 is a top view of the template with a plurality of holes used in the packaging method according to the present invention). By arranging a plurality of holes 402 in the template, the ineffective material can be omitted, and the weight of the template can be reduced.

According to an embodiment of the present invention, the packaging structure shown in FIG. 4 can be produced using the above-mentioned template, with the packaging method shown in FIG. 6.

The present invention is applicable to packaging with substrates or leadframes and the like, (such as FBGA (Fine-Pitch Ball Grid Array), Quad Flat No-Lead (QFN), and Quad Flat Package (QFP) and so on) where the chip, the bonding wires, and the bonding pads connected with the bonding wires must be protected.

While some preferred embodiments of the present invention are described above with reference to the accompanying drawings, the present invention is not limited to the details in those embodiments. Those skilled in the art can make modifications and variations to the technical scheme of the present invention, without departing from the spirit of the present invention. However, all such modifications and variations shall be deemed as falling into the protected domain of the present invention.

In addition, it should be understood that the technical features described in the above embodiments can be combined in any appropriate manner, provided that there is no conflict among the technical features in the combination. To avoid unnecessary iteration, such possible combinations are not described here in the present invention.

Moreover, different embodiments of the present invention can be combined freely as required, as long as the combinations don't deviate from the ideal and spirit of the present invention. However, such combinations shall also be deemed as falling into the scope disclosed in the present invention.

The invention claimed is:

1. A packaging method, comprising:
   providing a substrate;
   mounting a plurality of chips on the substrate;
   for each of the plurality of chips, executing steps of:
      electrically connecting the substrate with the chips via bonding wires through a wire bonding process;
      coating a surface coating material on the bottom surface of a template;
      placing the template on the substrate, the template having a cavity configured to expose entire chips, the bonding wires, and bonding pads connected with the bonding wires, the height of the template is higher than the height of the bonding wires, and a plurality of holes are formed in the template except for the cavity;
      filling into the cavity an epoxy encapsulation material through an adhesive dispensing process, and forming a protective layer by executing a curing process of the epoxy encapsulation material;
      cleaning the surface coating material with an organic solvent; and
      removing the template;
   wherein
   a solder ball array is formed on the bottom surface of the substrate through a ball mounting process; and
   cutting through the substrate by a singulation process so as to target each of the plurality of chips to form a packaging structure.

2. A template used in the packaging method according to claim 1, wherein the template has a cavity configured to expose the chip, the bonding wires, and the bonding pads connected with the bonding wires, and the height of the template is higher than the height of the bonding wires, wherein a plurality of holes are formed in the template except for the cavity.

* * * * *